(12) United States Patent
Kim et al.

(10) Patent No.: US 8,709,934 B2
(45) Date of Patent: Apr. 29, 2014

(54) ELECTRONIC SYSTEM WITH VERTICAL INTERMETALLIC COMPOUND

(75) Inventors: BaeYong Kim, Seoul (KR); Bongsuk Choi, Kyoungki-do (KR); Oh Han Kim, Ichon-si (KR)

(73) Assignee: Stats ChipPac Ltd., Singapore (SG)

( * ) Notice: Subject to any disclaimer, the term of this patent is extended or adjusted under 35 U.S.C. 154(b) by 624 days.

(21) Appl. No.: 11/758,635

(22) Filed: Jun. 5, 2007

(65) Prior Publication Data
US 2008/0303142 A1 Dec. 11, 2008

(51) Int. Cl.
*H01L 21/44* (2006.01)

(52) U.S. Cl.
USPC ........... 438/613; 438/106; 438/612; 257/737; 257/738

(58) Field of Classification Search
USPC ............ 257/737, 738, E23.01; 438/106, 612, 438/613
See application file for complete search history.

(56) References Cited

U.S. PATENT DOCUMENTS

| | | | |
|---|---|---|---|
| 5,296,649 A | 3/1994 | Kosuga et al. | |
| 5,466,635 A * | 11/1995 | Lynch et al. | 438/614 |
| 5,773,897 A | 6/1998 | Wen et al. | |
| 5,796,591 A * | 8/1998 | Dalal et al. | 361/779 |
| 5,834,366 A * | 11/1998 | Akram | 438/614 |
| 6,070,321 A * | 6/2000 | Brofman et al. | 29/840 |
| 6,337,445 B1 * | 1/2002 | Abbott et al. | 174/260 |
| 6,809,415 B2 * | 10/2004 | Tsukada et al. | 257/693 |
| 7,087,996 B2 | 8/2006 | Danielson et al. | |
| 7,091,619 B2 | 8/2006 | Aoyagi | |
| 2002/0121709 A1 * | 9/2002 | Matsuki et al. | 257/786 |
| 2003/0057551 A1 * | 3/2003 | Datta et al. | 257/737 |
| 2006/0055032 A1 * | 3/2006 | Chang et al. | 257/734 |

\* cited by examiner

*Primary Examiner* — Ori Nadav
(74) *Attorney, Agent, or Firm* — Ishimaru & Associates LLP

(57) ABSTRACT

An electronic system is provided including forming a substrate having a contact, forming a conductive structure over the contact, mounting an electrical device having an external interconnect over the conductive structure, and forming a conductive protrusion from the conductive structure in the external interconnect.

9 Claims, 3 Drawing Sheets

ELECTRONIC SYSTEM WITH VERTICAL INTERMETALLIC COMPOUND

TECHNICAL FIELD

The present invention relates generally to electronic system and more particularly to electronic system with a substrate.

BACKGROUND ART

Across all sectors, industries, and geographies, demands continue for the electronic industry to provide products that are lighter, faster, smaller, multi-functional, more reliable, and more cost-effective. In order to meet these requirements of so many and varied consumers, more electrical circuits need to be more highly integrated to provide the functions demanded. Across virtually all applications, there continues to be growing demand for reducing size, increasing performance, and improving features of integrated circuits.

The seemingly endless requirements are no more visible than with products in our daily lives. Smaller and denser integrated circuits are required in many portable electronic products, such as cellular phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. Increased miniaturization of electronic products typically involves miniaturization of components, greater packaging density of integrated circuits ("ICs"), higher performance, and lower cost. As new generations of electronic products are released, the number of integrated circuits used to fabricate them tends to decrease due to advances in technology. Simultaneously, the functionality of these products increases.

Semiconductor package structures continue to advance toward miniaturization to increase the density of the components that are packaged therein while decreasing the sizes of the end products having the IC products. This is in response to continually increasing demands on information and communication apparatus for ever-reduced sizes, thicknesses, and costs, along with ever-increasing performance.

Different challenges arise from increased functionality integration and miniaturization. For example, a semiconductor product having increased functionality may be made smaller but may still be required to provide a large number of inputs/outputs (I/O) interface. The size reduction increases the I/O density for the integrated circuit package and its respective integrated circuit carriers.

The ever-increasing I/O density trend presents a myriad of manufacturing problems. Some of these problems reside integrated circuit manufacturing realm. Others problems involve mounting these increase I/O density integrated circuits on carriers for packaging.

For example, attaching integrated circuits onto a carrier typically involve subjecting the carrier to elevated temperatures for forming electrical and mechanical connections between the integrated circuit and the carrier. These elevated temperatures may cause the integrated circuits and the carrier to expand at different rates creating problems at the contact points.

For example, flip-chip packaging technology has found widespread use because of its advantage in size, performance, flexibility, reliability and cost over other packaging methods. Flip chip packaging employs direct electrical connection of face-down integrated circuit (IC) chips onto substrates, circuit boards, or carriers, by means of conductive bumps on the chip bond pads, replacing older wire bonding technology where face-up chips sit on substrates with wire connection to each bond pad.

During flip chip packaging, the IC chip with bump array can be placed facedown on a substrate with a matching bump array, and the assembly is heated to make a solder connection. Typically, flip chip packages provide fine bump pitch, small bump pad diameter, and large die size. The flip chip attributes in conjunction with the heating or reflow process cause manufacturing problems. For example, the expansion rate difference between the integrated circuit and the substrate during reflow results in reliability problems at the connection between the integrated circuits and the substrate.

More specifically, concerns regarding environmental contamination are driving the electronics industry to implement lead-free solder alloys. This includes the material systems used to attach or connect integrated circuit within electronic products. For example, typical flip chip bonding techniques utilizes coined SOP (Solder On Pad) due to wetting capability and uniformity of height. However, in the case of conventional SOP, the failure caused by a crack in the SOP due to stress from the coefficient of thermal expansion (CTE) mismatch between underfill and substrates at intermetallic compound (IMC) layer.

Typical flip chip connections with coined SOP form IMC layers at the substrate side and at the flip chip side. Although the IMC layers are needed to ensure good solder joint, the thickness of the IMC layers may weaken the solder joint. IMC layers tend to be more brittle resulting in weaker solder joint connections and attachment of the flip chip with the substrate. The fragility of the solder joint may increase over time and elevated temperatures through the expansion of the IMC layer parallel to the substrate and the flip chip creating reliability problems.

Thus, a need still remains for an electronic system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an electronic system including forming a substrate having a contact, forming a conductive structure over the contact, mounting an electrical device having an external interconnect over the conductive structure, and forming a conductive protrusion from the conductive structure in the external interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
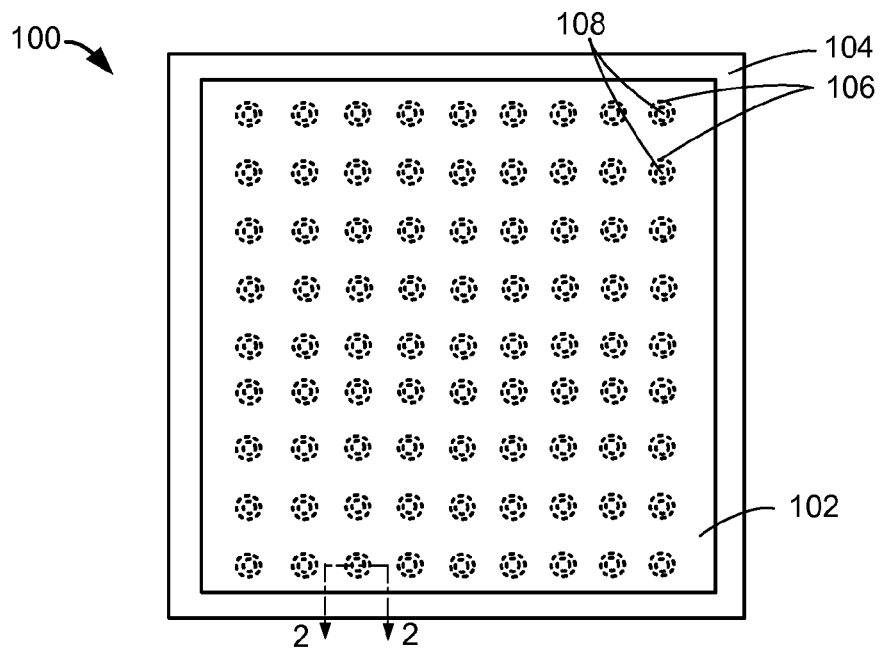
FIG. 1 is a top view of an electronic system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an electronic system 100 in an embodiment of the present invention. The top view depicts an electrical device 102, such as integrated circuit die, a flip chip, or a package integrated circuit, over a substrate 104. For example, the substrate 104 may be a laminate substrate.

The top view also depicts external interconnects 106, such as solder bumps or solder balls, of the electrical device 102 having conductive protrusions 108 therein. Both the external interconnects 106 and the conductive protrusions 108 are shown as dotted lines.

For illustrative purposes, the electrical device 102 has the external interconnects 106 shown in an array configuration, although it is understood that the electrical device 102 may have the external interconnects 106 in a different configuration. For example, the electrical device 102 may have the external interconnects 106 in a peripheral configuration, a mixed array configuration with different densities of the external interconnects 106, or partially depopulated configuration with not all available slots for the external interconnects 106 having an instance of the external interconnects 106.

Figure 2:
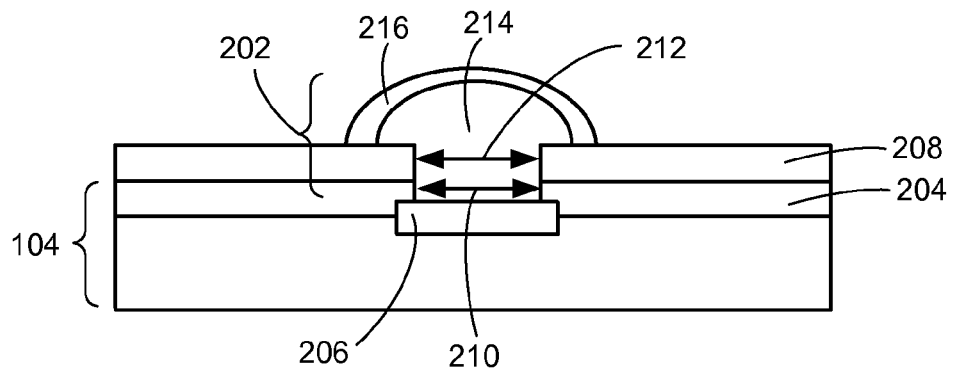
FIG. 2 is a cross-sectional view of the substrate of FIG. 1 along a line 2-2 in a forming phase of one of the conductive pads.

Referring now to FIG. 2, therein is shown a cross-sectional view of the substrate 104 of FIG. 1 along a line 2-2 in a forming phase of one of conductive structures 202. The cross-sectional view depicts the substrate 104 having a contact mask 204, such as a solder mask, exposing a contact 206, such as a contact pad or a conductive line. A temporary mask 208, such as a photoresist mask, is preferably over the contact mask 204 and the rest of the substrate 104.

The contact mask 204 preferably has a first opening 210 exposing the contact 206. The temporary mask 208 preferably has a second opening 212 exposing the contact 206 through the first opening 210. For illustrative purposes, the cross-sectional view depicts the first opening 210 and the second opening 212 having substantially the same horizontal dimension, although it is understood that the first opening 210 and the second opening 212 may expose the contact 206 with different horizontal dimensions. One of the conductive structures 202, such as a solder wettable metal pad, is formed over the contact 206. The conductive structures 202 brim out of the second opening 212 and are over the temporary mask 208 adjacent to the second opening 212.

Each of the conductive structures 202 has a core metal 214 and a cap 216. The core metal 214 may be formed from a number of different materials. For example, the core metal 214 may be formed with copper (Cu) or nickel (Ni). The core metal 214 is over and directly in contact with the contact 206 filling the first opening 210 and the second opening 212. The core metal 214 flows out of the second opening 212 over the temporary mask 208 adjacent to the second opening 212 forming a geometric configuration resembling a mushroom. The cap 216, such as a solder cap, is preferably formed conformably over the core metal 214 above the temporary mask 208.

The core metal 214 may be formed by a number of different processes. For example, the core metal 214 may be formed with electroplating or electroless plating. Likewise, the cap 216 may be formed by a number of different processes. For example, the cap 216 may be formed with electroplating or electroless plating without requiring a coining process.

Figure 3:
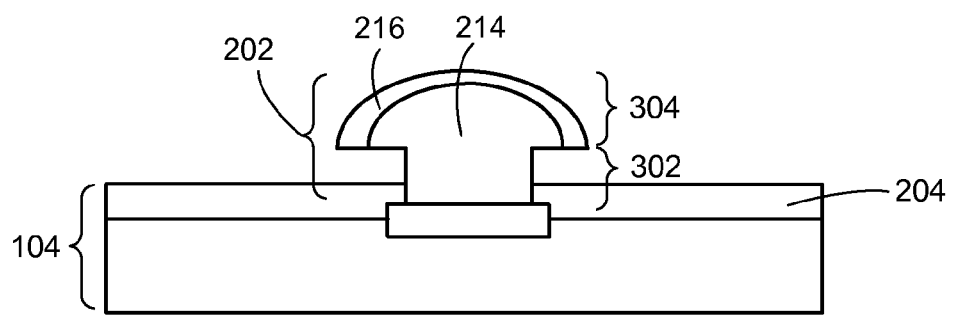
FIG. 3 is the structure of FIG. 2 in a removing phase of the temporary mask of FIG. 2.

Referring now to FIG. 3, therein is shown the structure of FIG. 2 in a removing phase of the temporary mask 208 of FIG. 2. The removal of the temporary mask 208 exposes the contact mask 204 of the substrate 104, a column portion 302 of the conductive structures 202, and a convex portion 304 of the conductive structures 202 connected to the column portion 302.

A portion of the convex portion 304 connected to the column portion 302 is preferably planar resulting from the planar surface of the temporary mask 208. The convex portion 304 also includes the cap 216 over the core metal 214 of the convex portion 304. The end of the cap 216 is also planar to the portion of the convex portion 304 connected to the column portion 302 also resulting from the planar surface of the temporary mask 208.

Figure 4:
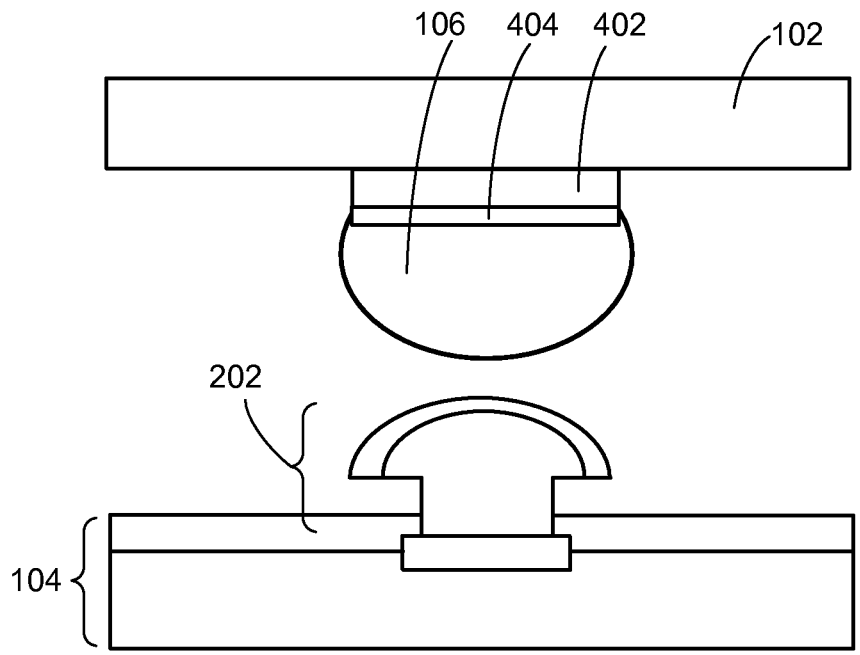
FIG. 4 is the structure of FIG. 3 in a mounting phase of the electrical device.

Referring now to FIG. 4, therein is shown the structure of FIG. 3 in a mounting phase of the electrical device 102. The cross-sectional view of the electrical device 102 is along a line 2-2 of FIG. 1. The electrical device 102, such as an integrated circuit die or a flip chip, undergoes a mounting and is shown suspended over the substrate 104 with one of the external interconnects 106, such as solder bumps or solder balls, over one of the conductive structures 202.

Each of the external interconnects 106 preferably attaches to a bond pad 402 of the electrical device 102. An interface between the external interconnects 106 and the bond pad 402 includes a transition layer 404, such as an intermetallic compound (IMC) layer. Good solder joint strength includes the microstructure of bulk solder joint, such as the external interconnects 106, and the intermetallic compound (IMC) layer, such as the transition layer 404.

A thickness of the transition layer 404 impacts solder joint strength. The transition layer 404, such as the IMC layer, is a part of a solder joint because it facilitates bonding between the external interconnects 106 and the bond pad 402. However if the thickness of the transition layer 404 is too thick, the transition layer 404 adversely affects the strength of the solder joint because the transition layer 404 is generally the most brittle part of the solder joint.

Figure 5:
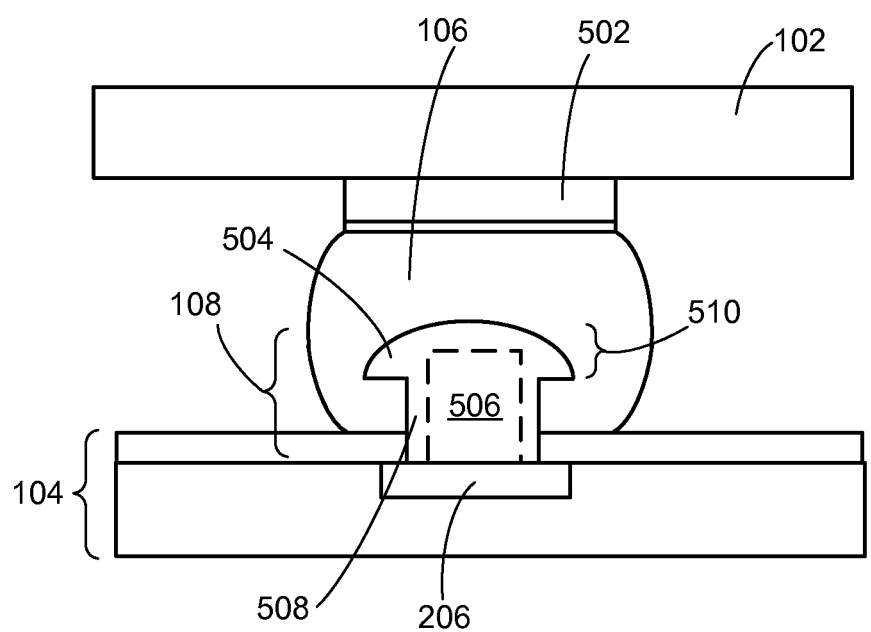
FIG. 5 is the structure of FIG. 4 in an attaching phase one of the external interconnects.

Referring now to FIG. 5, therein is shown the structure of FIG. 4 in an attaching phase one of the external interconnects 106. The electrical device 102 attaches with the substrate 104 by attaching the external interconnects 106 to the conductive structures 202 of FIG. 4 forming conductive pads 502.

The attaching process may be performed by a number of different processes. For example, the external interconnects 106 and the conductive structures 202 may undergo reflow process melting and bonding the external interconnects 106 and the conductive structures 202.

The attaching process subjects the external interconnects 106 and the conductive structures 202 to elevated temperatures to predetermined levels for predetermined durations. The elevated temperatures promote diffusion of materials of the core metal 214 of FIG. 3 forming a transition cover 504, such as an intermetallic compound (IMC) cover, of the conductive protrusions 108 within the external interconnects 106 and over the contact 206. The transition cover 504 is at an outer surface of the conductive protrusions 108 and in direct contact with a non-horizontal side of the substrate 104.

The transition cover 504 surrounds a conductive core 506 of the conductive pads 502, wherein the conductive core 506 is formed from the core metal 214. The conductive core 506 preferably has a geometric configuration of a column or pillar over the contact 206.

As described earlier, a good solder joint strength includes the microstructure of bulk solder joint, such as the external interconnects 106, and the intermetallic compound (IMC) cover, such as the transition cover 504. The conductive protrusions 108 have a geometric configuration resembling a mushroom with a sidewall portion 508 of the transition cover 504 along the conductive core 506 and a cap portion 510 of the transition cover 504 connected to the sidewall portion 508 and over the conductive core 506. The cap portion 510 of the transition cover 504 includes a planar bottom surface integral with a convex top surface. The planar bottom surface is further integral with the sidewall portion 508. The transition cover 504, such as an intermetallic compound (IMC) cover, surrounds the conductive core 506.

It has been discovered that the conductive core 506, such as the copper or nickel solder wettable metal pad, with the transition cover 504 disturbs propagation of cracks that may weaken the solder joint or the attachment between the external interconnects 106 and the conductive pads 502. Non-melted pure copper or nickel pad have higher strength and softness than IMC layers or covers. The conductive core 506 may also include platinum (Pt) and palladium (Pd).

Solder joint strength may be affected by both lack of intermetallic formation as well as excess intermetallics. The conductive core 506 continues to attach with the contact 206 as well as the sidewall portion 508 of the transition cover 504 limiting the brittle contact from the transition cover 504 with the contact 206. The sidewall portion 508 and the cap portion 510 of the transition cover 504 in the external interconnects 106 spread the intermetallics within the external interconnects 106 for forming a robust solder joint.

Figure 6:
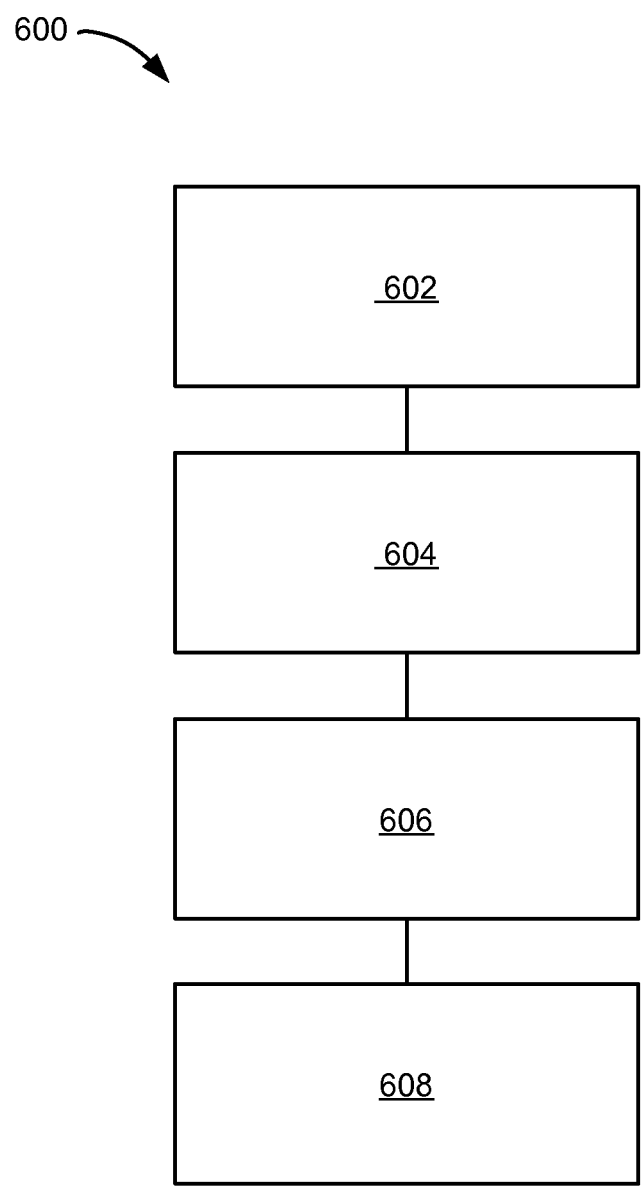
FIG. 6 is a flow chart of an electronic system for manufacturing the electronic system in an embodiment of the present invention.

Referring now to FIG. 6, therein is shown a flow chart of an electronic system 600 for manufacturing the electronic system 100 in an embodiment of the present invention. The system 600 includes forming a substrate having a contact in a block 602; forming a conductive structure over the contact in a block 604; mounting an electrical device having an external interconnect over the conductive structure in a block 606; and forming a conductive protrusion from the conductive structure in the external interconnect in a block 608.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the electronic system of the present invention furnishes important and heretofore unknown and unavailable solutions, capabilities, and functional aspects for improving yield, increasing reliability, and reducing cost of electronic system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an electronic system comprising:
   forming a substrate having a contact;
   forming a conductive structure over and directly in contact with the contact;
   mounting an electrical device having an external interconnect over the conductive structure; and
   forming a conductive protrusion from the conductive structure in the external interconnect, wherein forming the conductive protrusion includes:
   forming a conductive core over the contact, and
   forming a transition cover of an intermetallic compound around the conductive core, the transition cover having a sidewall portion around the conductive core and contacting the contact, the sidewall portion extending vertically along the sides of the conductive core, wherein the transition cover includes a cap portion integral with the sidewall portion, and wherein the cap portion includes a convex top surface and a planar bottom surface.

2. The method as claimed in claim 1 wherein forming the conductive structure includes:
   forming a column portion over the contact;

forming a convex portion connected to the column portion; and forming a cap over the convex portion.

3. The method as claimed in claim 1 wherein:
  forming the conductive core over the contact includes forming copper, nickel, platinum, palladium, or a combination thereof over the contact; and
  mounting the electrical device having the external interconnect over the conductive structure includes mounting the electrical device having solder over the conductive structure.

4. The method as claimed in claim 1 wherein forming the conductive protrusion includes reflowing the external interconnect and the conductive structure.

5. A method of manufacture of an electronic system comprising:
  forming a substrate having a contact;
  forming a conductive structure including copper or nickel over and directly in contact with the contact;
  mounting an electrical device having an external interconnect including solder over the conductive structure; and
  forming a conductive protrusion from the conductive structure in the external interconnect, wherein forming the conductive protrusion includes:
    forming a conductive core over the contact, and
    forming a transition cover of an intermetallic compound around the conductive core, the transition cover having a sidewall portion around the conductive core and contacting the contact, the sidewall portion extending vertically along the sides of the conductive core, wherein the transition cover includes a cap portion integral with the sidewall portion, and wherein the cap portion includes a convex top surface and a planar bottom surface.

6. The method as claimed in claim 5 wherein forming the conductive structure includes forming a cap including solder.

7. The method as claimed in claim 5 wherein:
  forming the conductive core over the contact includes forming copper or nickel over the contact.

8. The method as claimed in claim 5 wherein forming the conductive protrusion from the conductive structure in the external interconnect includes attaching the electrical device and the substrate.

9. The method as claimed in claim 5 wherein mounting the electrical device includes mounting an integrated circuit device.

* * * * *